United States Patent [19]

Victor

[11] 4,376,399
[45] Mar. 15, 1983

[54] MICROCIRCUIT COVER REMOVER

[76] Inventor: James Victor, 1460 Uppingham Dr., Thousand Oaks, Calif. 91360

[21] Appl. No.: 194,766

[22] Filed: Oct. 7, 1980

[51] Int. Cl.³ .............................................. B26D 7/02
[52] U.S. Cl. ......................................... 83/13; 83/100; 83/409; 83/435.1; 83/925 R; 53/381 R; 414/412
[58] Field of Search ................... 83/13, 54, 100, 403.1, 83/409, 425, 435.1, 437, 422, 701, 925 R; 29/402.03, 402.08, 426.1, 564.3; 53/381 R, 492; 269/229, 231, 239; 414/412

[56] References Cited

U.S. PATENT DOCUMENTS

| | | | |
|---|---|---|---|
| 2,379,844 | 7/1945 | Weinberger | 83/409 |
| 3,917,505 | 11/1975 | Schulze | 83/435.1 X |
| 3,994,326 | 11/1976 | Sarten | 83/437 X |
| 4,003,276 | 1/1977 | Schmitt | 83/100 |
| 4,155,283 | 5/1979 | Mericle | 83/435.1 X |

*Primary Examiner*—Stephen G. Kunin
*Assistant Examiner*—Robert P. Olszewski
*Attorney, Agent, or Firm*—Fulwider, Patton, Rieber, Lee & Utecht

[57] ABSTRACT

Apparatus and a related method for its operation, for removing a cover from a microcircuit package without significant damage to the package or contamination of its contents. The apparatus includes a work table on which the package to be opened is placed, a clamping assembly for removably securing the package to the work table, and a cutter blade positioned in an operative relationship with the clamped package. Also included are adjustment controls to allow for adjustment for the width, length and depth of the cut, and control circuitry for effecting movement of the work table in a cutting stroke with respect to the cutter blade, to cut along an edge of the cover, and for automatically reversing the table movement to return it to its starting position. A vacuum system is employed to remove and contain metal fragments and thereby minimize contamination of the package.

6 Claims, 11 Drawing Figures

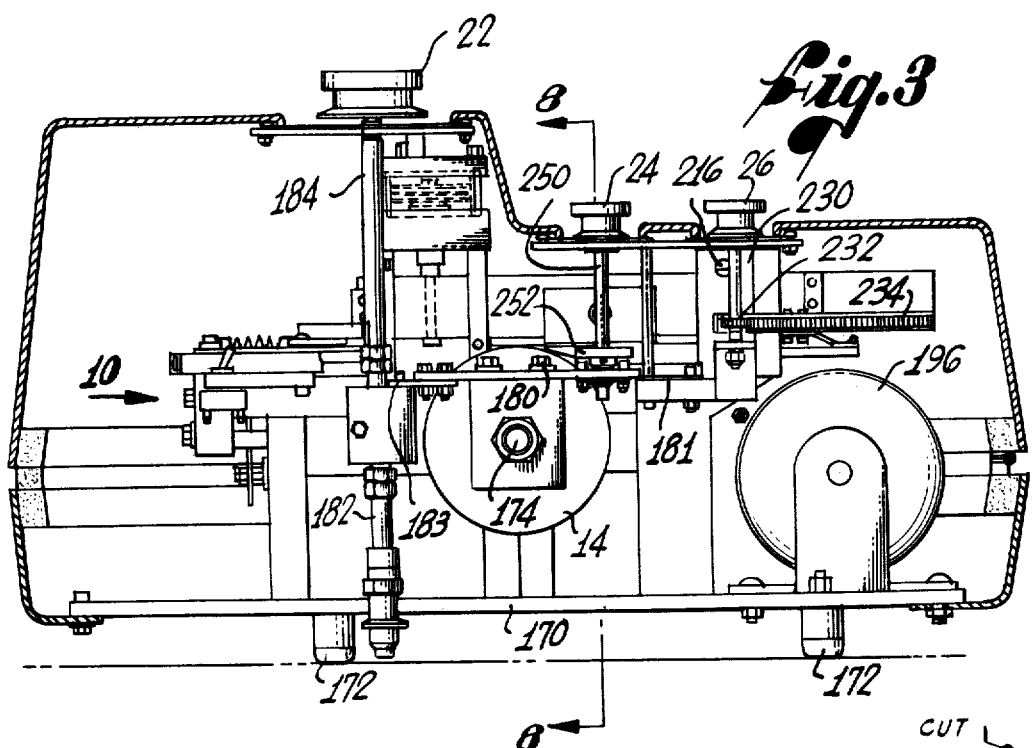
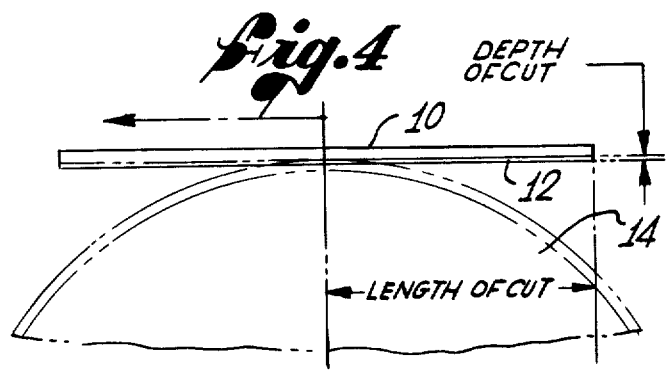
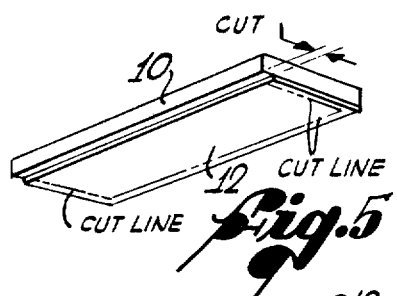
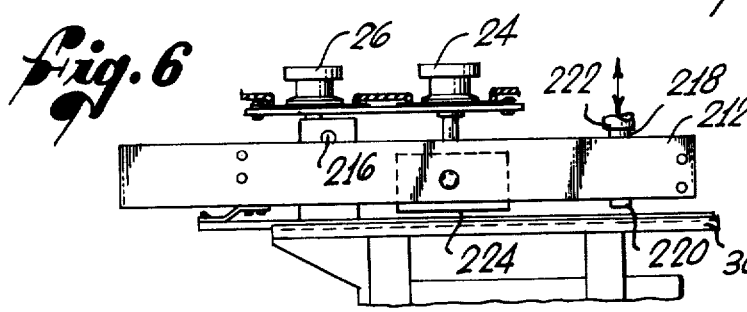
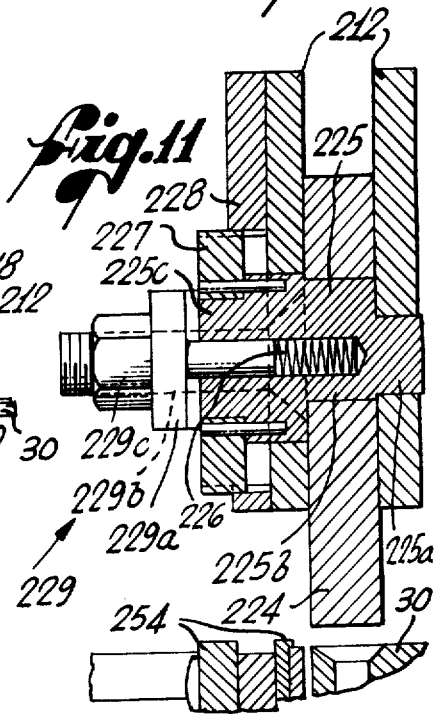

MICROCIRCUIT COVER REMOVER

BACKGROUND OF THE INVENTION

This invention relates generally to the manufacture and repair of microcircuitry, and, more particularly, to the manufacture and repair of hybrid microcircuitry. In hybrid microcircuitry, various electronic components, some of which may be small integrated circuits and some which may be discrete components, are assembled together on a single substrate or circuit board, which is typically then enclosed in a sealed metal package, the necessary electrical connections to the circuitry being made by means of insulated terminal leads brought out through the edges of the package. Sealing is usually effected by welding a lid to the package after the circuitry is placed in it.

If the resultant hybrid circuit package satisfactorily performs its desired electronic function, there is, of course, no need to remove the lid after it has been welded or otherwise fixed in position. Frequently, however, such packages can fail in final testing and may have to be discarded unless the package can be opened to repair the circuit. Until now, there has been no satisfactory technique for opening such a package without either risking damage to the electronic components or requiring costly machining before resealing of the package.

Accordingly, it is an important object of the present invention to provide apparatus, and a corresponding method for its operation, for removing the lid of a microcircuit package in a reliable and semi-automatic manner. Ideally, such apparatus should be capable of accommodating a variety of package sizes and lid thicknesses and should be able to effect removal of the lid without damage to the electronic components contained within the package. The present invention is directed to these ends.

SUMMARY OF THE INVENTION

The present invention resides in apparatus and a related method for removing a microcircuit package cover quickly and reliably, without risk of damage to the package or the electronic components contained within it. Basically, and in general terms, the invention comprises a work table, means for adjustably securing the microcircuit package on the work table, cutting means positioned in an operative relationship with respect to the work table, and means for translating the table with respect to the cutting means, thereby making a cut along an edge of the package cover. The means for adjustably securing the microcircuit package on the work table preferably includes means for adjusting the width of cut and means for adjusting the length of cut. The cutting means of the presently preferred embodiment includes a circular rotatable cutter blade located for the most part below the table, the cutter blade being adjustable perpendicularly with respect to the table to adjust for the depth of cut. The apparatus preferably also includes suction means located close to the cutting edge of the cutter blade, to ensure that metal fragments are quickly drawn away and contained to avoid possible damage to the electronic components.

More specifically, the means for translating the table is operative to translate the table first in one direction to effect a cut along an edge of the package, and includes means for automatically reversing the direction of translation, to return the table and the microcircuit package to a starting position after completion of the cut. In the presently preferred embodiment of the invention, translation of the table is effected by means of a combined pneumatic and hydraulic cylinder, and the means for adjustably securing the package on the work table includes a second pneumatic cylinder.

In accordance with the method of the invention, a cover on a microcircuit package is removed by first adjustably securing the package on the work table, rotating the cutter blade and initiating operation of the machine to perform a single cut. The apparatus then automatically translates the work table to move the microcircuit package through the cutter blade, and then reverses the direction of translation of the work table to quickly return the work table and package to their starting position. The step of adjustably securing the package to the table includes the subsidiary steps of adjusting the width, length and depth of cut. To completely remove the cover from the package, which is usually rectangular in shape, a second cut is normally made along the edge opposite and parallel to the one along which the first cut was made, since this second cut could be made without further adjustment of the apparatus. Then the apparatus is adjusted for a different length of cut, and third and fourth cuts are made along the remaining edges of the package.

It will be appreciated from the foregoing that the present invention represents a significant advance in the field of manufacture, testing and repair of microcircuit packages of the same general type described above. In particular, the invention provides a hitherto unavailable technique for reliably and quickly removing covers from microcircuit packages of the type used to house hybrid circuitry. Other aspects and advantages of the invention will become apparent from the following more detailed description, taken in conjunction with the accompanying drawings.

BRIEF DESCRIPTION OF THE DRAWINGS

FIG. 3 is a rear elevational view of the apparatus shown in FIG. 2;

FIG. 4 is an enlarged fragmentary view of the cutter blade of the apparatus shown in relation to a package to be opened;

FIG. 5 is a simplified perspective view of a typical microcircuit package of which the cover is to be removed, showing the effect of a first cut along one edge of the package;

FIG. 6 is a fragmentary front elevational view of the apparatus, showing the microcircuit package clamping assembly;

FIG. 11 is an enlarged, fragmentary sectional view showing structural detail of a presser bar adjustment assembly.

DESCRIPTION OF THE PREFERRED EMBODIMENT

Figure 1:
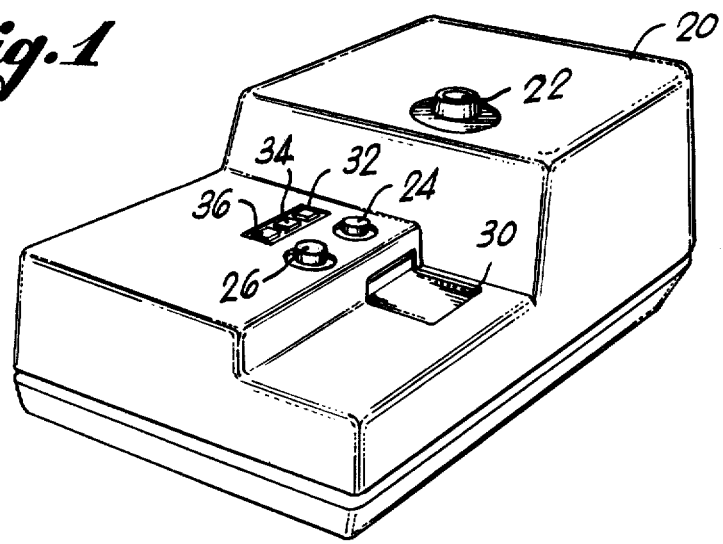
FIG. 1 is a perspective view of the apparatus of the invention, as viewed with its external cover in position.

As shown in the drawings for purposes of illustration, the present invention is principally concerned with apparatus for the removal of covers from flat or plug-in type microcircuit packages. The covers may be seam welded, brazed, or affixed with epoxy or other means to the packages. As shown in simplified form in FIG. 5, a microcircuit package of this type, indicated by reference numeral 10, is a flat, generally rectangular package having relatively thick side walls and end walls and a thinner rectangular cover, indicated by reference numeral 12. Typically, the cover 12 is seam welded along its edges to seal the package.

Hybrid circuits of the type that are housed in such packages are relatively expensive to manufacture, principally because of the precision assembly work that is required. Accordingly, it is often desirable to be able to open the package after final sealing, in order to repair, analyze or modify the circuitry. Removal of a package cover of this type has been extremely difficult prior to the present invention. Moreover, after removal of the cover, the side walls and end walls of the housing will almost always require surface refinishing before a new cover can be installed. Accordingly, it will be appreciated that there has been a real need for a technique to remove microcircuit package covers rapidly and reliably, without damaging the package or the components it contains, and without the need for further machining of the package before installing a new cover.

In accordance with the present invention, the cover 12 of the microcircuit package 10 can be removed rapidly and reliably, without damaging the package or its component parts, by making a series of precision cuts along the edges of the cover, the cuts being accurately controlled in depth and width in order to detach the cover from the package 10. FIG. 5 shows the package 10 after a first cut along one edge of the cover 12, and indicates the locations of three further cuts necessary to completely remove the cover. The specific manner in which these cuts are made by using the apparatus of the present invention will become apparent as this description proceeds. In principle, however, the cuts are made in the manner shown in FIG. 4. A rotating cutter blade 14 makes each cut from below the package 10, the package being positioned with its cover 12 disposed downwards. Critical to this cutting process are mechanisms for accurately and adjustably clamping the package and for automatically translating it with respect to the cutter blade 14, in order to make cuts of the desired width, depth and length.

As shown in FIG. 1, the apparatus of the invention achieves these ends while still using relatively simple controls. The apparatus is shown in FIG. 1 with its removable cover 20 in position. The apparatus is compact in size, approximately 27" by 19" by 16" high, and is basically a table-top machine. Three adjustable control knobs are included in the apparatus and are located outside the cover 20; a depth-of-cut adjustment knob 22, a width-of-cut adjustment knob 24, and a length-of-cut adjustment knob 26. The details of operation of these adjustment knobs will be described shortly. For the moment, it will suffice to say that in operating the machine, a package 10 is placed on a work table 30 with the welded cover 12 facing down, and adjustments are made for the depth-of-cut, as dictated by and usually equal to the lid thickness, the width of cut, as dictated by the weld width and the thickness of the side walls and end walls of the package, and the length-of-cut, as dictated by the length of the edge of the cover to be next presented to the cutter blade 14. Naturally, the depth-of-cut and width-of-cut adjustments will probably be made relatively infrequently, but the length-of-cut adjustment will need to be changed before cutting the second pair of edges on a rectangular package.

After adjustments have been made, operation of the machine requires only the actuation of three push-button controls, including a power switch 32, a clamp switch 34, and a start switch 36. Operation of the power switch 32 begins rotation of the cutter blade 14 (FIG. 4) and energizes the control circuitry of the apparatus. Then, the package 10 is placed in position on the worktable 30, and the clamp switch 34 is actuated to secure the package 10 to the table. Finally, the start switch 36 is actuated momentarily, to initiate an automatic cutting sequence. In the automatic sequence, the work table 30 is translated in a direction parallel to the plane of the cutter blade 14 at a predetermined speed, thereby making the first cut along one edge of the package. At the same time, a vacuum system is switched on, to remove metal waste formed in the cutting operation. At the end of the cutting stroke, the direction of table translation is automatically reversed and the table 30 returns to its starting position at a more rapid speed. Then the clamp switch 34 is turned off to release the package, which must then be placed in position for the next cut. For rectangular packages, two opposite edges are usually cut first, then the length-of-cut adjustment knob 26 is rotated to correspond to the length of the other pair of edges.

Before turning to the mechanical details of the apparatus, operation of the invention will be described with reference to the schematic diagram of FIG. 7. The electrical components of the apparatus will be seen to include a conventional ac power supply, indicated at 40, a power supply fuse 42, a low pressure interlock switch 44, the power, clamp, and start switches 32, 34 and 36, respectively, a cutter motor 46, a vacuum motor 48, a reverse switch 50 and a stop switch 52. In addition, the control switches 32, 34 and 36 have associated indicator lights 52, 54 and 56, respectively, and corresponding series-connected resistors 58, 60 and 62, respectively. Finally, there are two electrical solenoids 64 and 66 for actuating two corresponding four-way pneumatic valves 68 and 70.

The pneumatic and related components of the apparatus include a clean air or nitrogen supply, operating at 80 to 120 p.s.i., indicated at 72, a filter 74, a pressure regulator 76, a supply pressure gauge 78, and a pneumatic cylinder 80 and piston 82 assembly. In addition, there is a second pressure regulator 84 and pressure gauge 86 for indication of the clamp pressure, and a second cylinder 88 and piston 90 used to effect clamping of the package on the work table.

The first pneumatic piston 82 is attached to an elongated rod 92 which, as will be seen later, is coupled to the work table 30 to apply the translational force to it. As indicated diagrammatically at 94, when the rod 92 is translated all the way to the right as viewed in FIG. 7, it automatically actuates both the reverse switch 50 and the stop switch 52, as will shortly be explained in more detail.

The rod 92 also has attached to it an additional piston 96 disposed in a hydraulic cylinder 98, the purpose of which is to control the speed of translation of the work table 30 during the cutting stroke. The hydraulic cylinder 98 has a port at each end, the two ports being connected by hydraulic lines 100 and 102 to an adjustable orifice 104 connected between the two ends of the cylinder. Thus, when the piston rod 92 is translated to the left, hydraulic fluid is passed from the left-hand end to the right-hand end of the hydraulic cylinder 98, through the orifice 104, which effectively controls the speed of movement of the piston rod 92 and the table 30. On the reverse stroke of the rod 92, however, the rod 92 can move at a faster speed, since there is a check valve 106 in the piston 96 and a second check valve 108 connected in parallel with the orifice 104. During right-hand motion of the rod 92, hydraulic fluid can flow through the check valve in the piston 96 and also from the right hand end to the left-hand end of the cylinder, thereby offering very little resistance to movement of the piston.

Completing the hydraulic system is a make-up cylinder 110, which is pressurized by an associated pneumatic cylinder 112, there being corresponding hydraulic and pneumatic pistons 114 and 116, respectively, coupled to a common piston rod 118.

The high pressue air supply 72 is connected by a line 120, through the filter 74 and the pressure regulator 76, and thence to the four-way valve 70. The air is also connected from the supply line 120 to the input port of other four-way valve 68, and also to the pneumatic cylinder 112 used to pressurize the hydraulic system. Four-way valve 68 is used to control the direction of translation of the piston rod 92. Accordingly, one output port of the valve 68 is connected by line 122 to the left-hand end of the pneumatic cylinder 80, and the other output port is connected by line 124 to the right-hand end of the cylinder 80. The other four way valve 70 is the clamp control valve, and one of its output ports is connected by line 126 to the lower side of the clamp cylinder 88, and the other is connected by line 128 through pressure regulator 84, and thence to the upper side of the cylinder 88.

Figure 7:
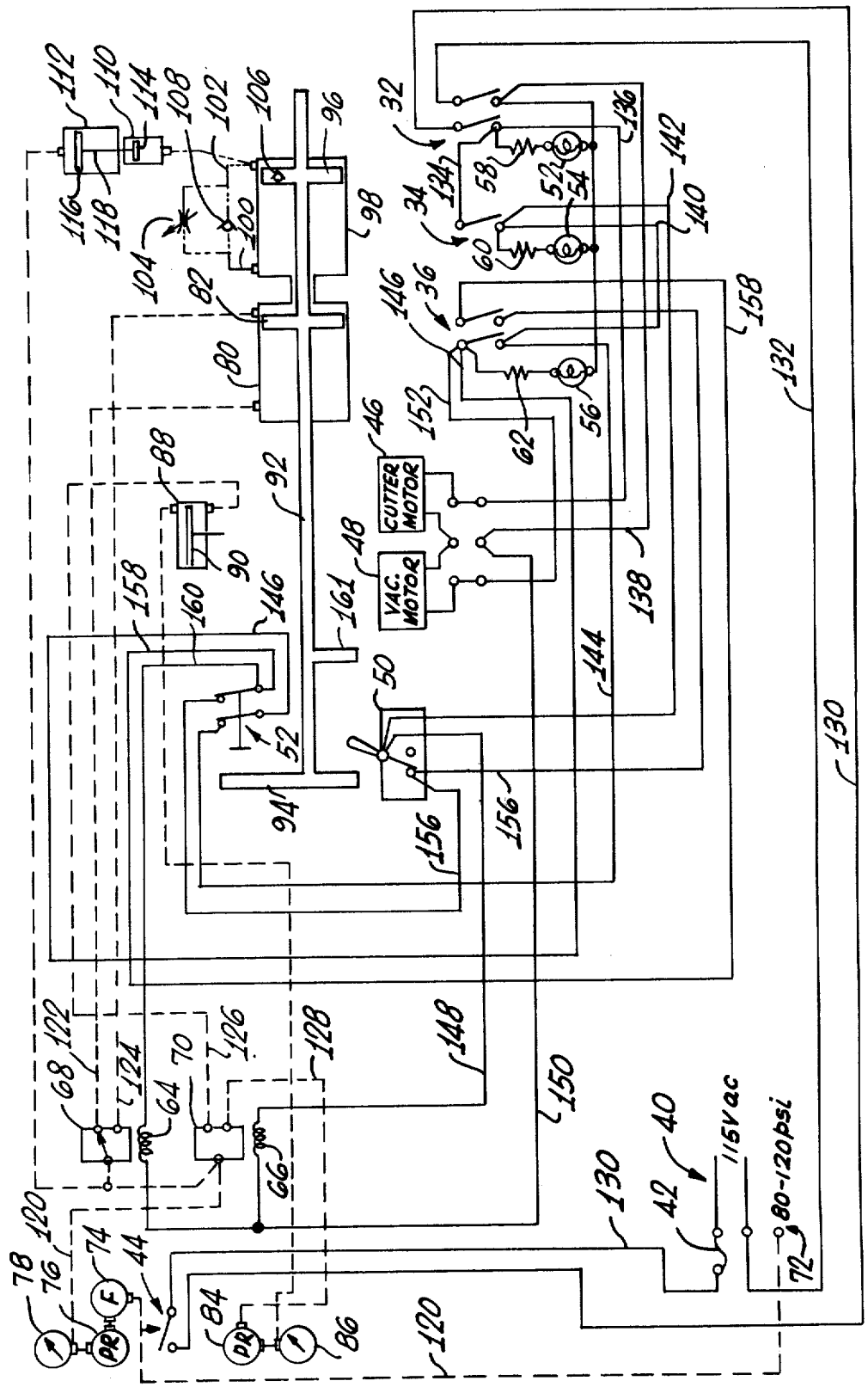
FIG. 7 is a schematic view showing the electrical, pneumatic and hydraulic connections between the various components of the apparatus.

Thus, when the valve 70 is in the position shown in FIG. 7, pressure is applied to the lower side of the piston 90 and the clamp is raised to its release position. When the solenoid 66 is energized and the valve 70 is moved to its other position, air is supplied to the upper side of the piston 90 and the clamp is lowered to its clamping position. Likewise with respect to the valve 68, when the valve is in the position shown in FIG. 7, air is supplied to the left-hand side of piston 82, and the piston rod 92 and the work table 30 are translated all the way to the right, as viewed in FIG. 7. When the solenoid 64 is energized, the valve 68 is moved to its other position and air is supplied to the right-hand side of the piston 82, to translate the piston and the work table 30 to the left. The electrical functions of the control circuit now to be described will be seen to initiate the operation of these valves in the desired sequence.

One side of the power supply 40 is connected through the fuse 42, and thence by line 130 to the interlock switch 44, which is a single-pole single-throw switch held in the closed position by an appropriate minimum pressure, such as 75 p.s.i., in the high pressure air line 120. Line 130 is connected from the switch 44 to one movable contact of the power switch 32. The other movable contact of the switch 32, which is a double-pole single-throw switch, is connected by line 132 to the other power supply terminal. When the power switch 32 is closed, power is supplied to the fixed contacts of the switch. This action immediately supplies power to the indicator light 52, through the resistor 58, and lights the power switch to indicate that it is closed. In addition, power is supplied over line 134 to the movable contact of the clamp switch 34, which is a single-pole single-throw switch. Also, power is supplied over line 136 to one terminal of the cutter motor 46, a return path from the cutter motor being supplied by line 138 back to the other fixed contact of the power switch 32. Thus, when the power switch is closed, the cutter motor 46 is turned on.

When the clamp switch 34 is closed, power is supplied through series resistor 60 to the indicator light 54, to indicate that the switch has been actuated, and is also supplied to lines 140 and 142 connected to the fixed contact of the clamp switch 34. Line 140 is connected to one fixed contact of the start switch 36, which is a double-pole single-throw switch of the momentary type. This arrangement does not allow the start switch to be activated unless the package is clamped first. The line 142 is connected to the movable contact of the reverse switch 50, which is a single-pole single-throw switch. The fixed contact of the start switch 36 to which line 140 is connected is also connected by line 144 to one contact of the stop switch 52, which is a double-pole single-throw switch. The corresponding movable contact of the switch 52 is connected by line 146 to the movable contact of switch 36. The movable contact of reverse switch 50 is also connected by line 148 to the solenoid 66 associated with valve 70, and thence by return line 150 to the return line 138 from the motors 46 and 48. Thus, when the clamp switch 34 is closed, power is applied to the solenoid 66 through line 142, 148, and thence through return lines 150 and 138. As mentioned earlier, actuation of the solenoid 66 applies air to the upper side of the clamping piston 90, and lowers the clamp into an operative position.

When the start switch 36 is next momentarily closed, power is supplied from the clamp switch through line 140, and thence through one pole of the start switch to the left hand fixed contact of switch 36. This also applies power through series resistor 62 and indicator light 56 to indicate that the start switch has been actuated, and further energizes lines 152, also connected to the left-hand movable contact of switch 36, and therefore energizes the vacuum motor 48, a return path from the vacuum motor being supplied by line 138.

On closure of the start switch 36 power is also supplied to solenoid 64 over a path comprising line 142 from the clamp switch 34 to the movable terminal of the reverse switch 50, thence through the reverse switch, which will be closed at the start of a cutting operation, and thence by line 156 from the fixed contact of the reverse switch to the right-hand fixed contact of the start switch 36. Then connection is made through the closed start switch 36 and by line 158 to the right-hand movable contact of the stop switch 52, and finally by line 160 from the same terminal of the stop switch to the solenoid 64. A return path from the solenoid 64 is provided through lines 150 and 138. As indicated earlier, actuation of solenoid 64 will divert air into line 124 and begin movement of the piston rod 92 in a left-hand direction. The stop switch 52, upon being released by an initial left-hand movement of the table 30 from its starting position, will return to a normally closed position.

It will be noted that the movable contact terminals of switch 52 are connected to the movable contact terminals of the start switch 36, over lines 146 and 158, respectively. In addition, the fixed contacts of switch 52 are connected to the fixed contacts of start switch 36, over lines 144 and 156, respectively. Accordingly, the switches 36 and 52 are effectively connected in parallel, and after the start switch 36 is released, the stop switch 52 will perform exactly the same function as start switch 36, as soon as the stop switch has been released by an initial table movement in the left-hand direction.

As indicated earlier, movement of the work table 30 in the left-hand direction performs a cutting operation on the workpiece, and at the end of a prescribed stroke, the direction of motion of the work table is to be reversed. As indicated diagrammatically at 161 in FIG. 7, an actuating mechanism connected to the piston rod 92 contacts the reverse switch 50 when the cutting stroke is complete and moves the switch in the left-hand direction, opening it. It will be recalled that the solenoid 64 is energized through a path which includes the reverse switch 50. Accordingly, when the reverse switch is opened, power is disconnected from the solenoid 64 and air is applied instead to line 122, and thence to the left-hand side of the pneumatic piston 82, thereby reversing movement of the piston rod 92 and the work table 30.

At the conclusion of the return stroke of the piston rod 92, the reverse switch 50 will be returned to its original position, and simultaneously the stop switch 52 will be opened to prevent any further movement of the piston rod 92 and the work table 30. At this point, the clamp switch 34 can be opened to release the package, and the cutting operation may be repeated on another edge of the package. After all the required cuts have been made along the package cover 12, the power switch 32 may be opened to switch off the apparatus. Now that the broad principles of operation of the apparatus have been explained, the relevant mechanical details will be described.

Figure 8:
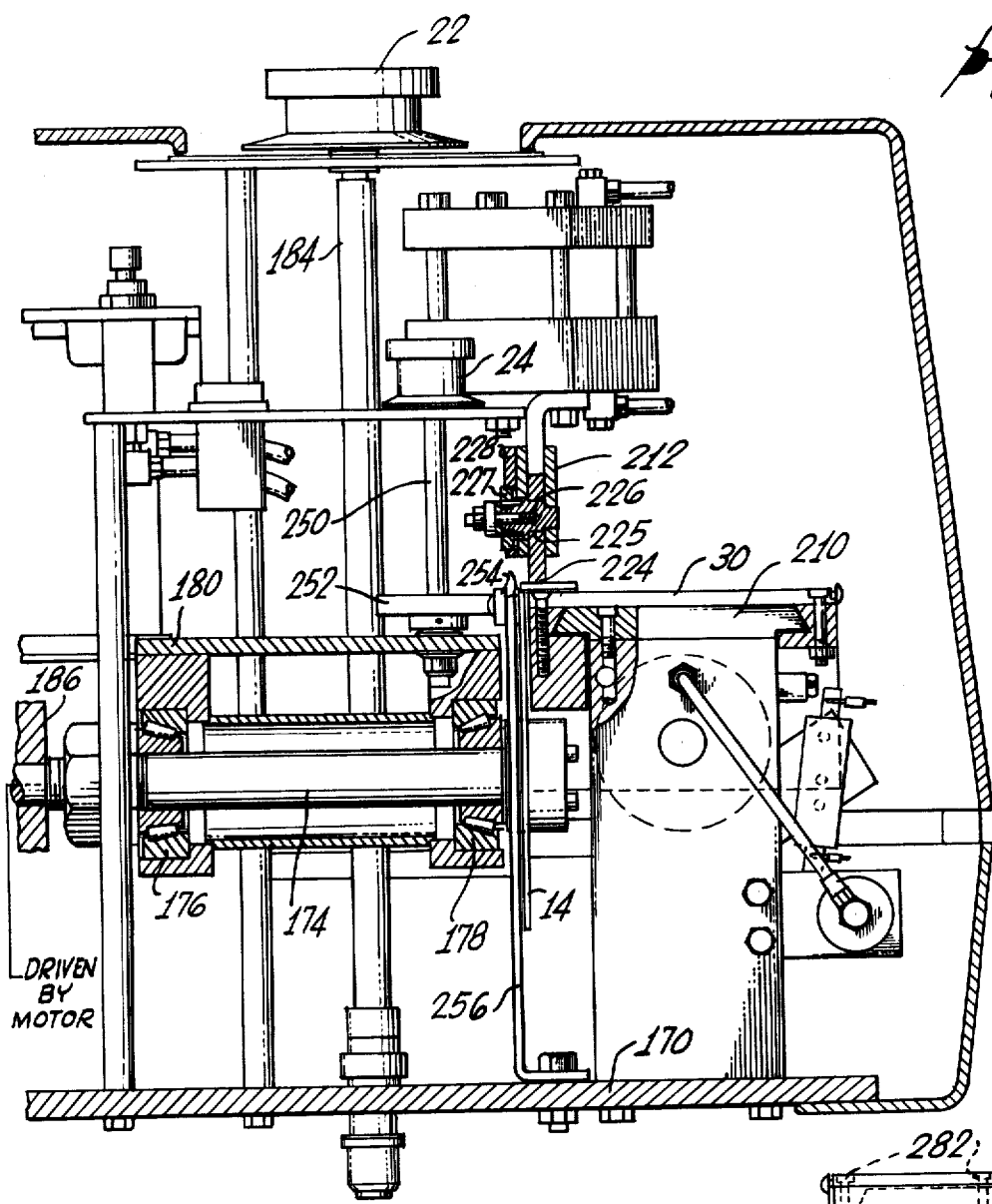
FIG. 8 is a fragmentary end elevational view, partly in section, taken generally in the direction shown by arrow 8 in FIG. 3.
Figure 9:
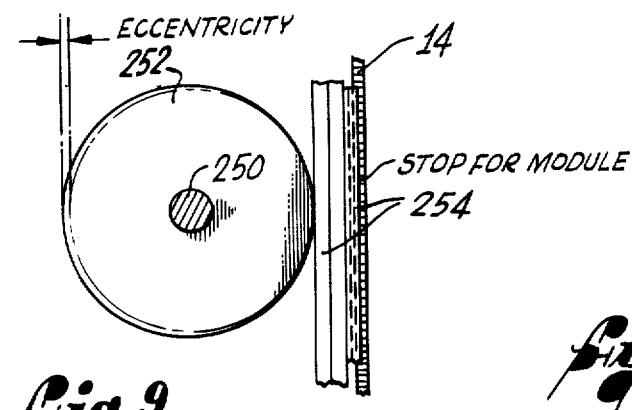
FIG. 9 is an enlarged, fragmentary plan view showing the manner of adjustment of a stop used to select the width of cut.

As shown in detail in FIGS. 2, 3, 6 and 8–10, the apparatus of the invention is mounted on a relatively heavy baseplate 170, which is supported on a plurality of feet 172 attached to the bottom of the plate, for convenient positioning on a table or workbench. The cutter blade 14 is mounted on a shaft 174 which extends horizontally across the apparatus and is journaled in two bearing blocks 176 and 178, as best shown in FIG. 8. As shown in FIG. 3, the bearing blocks are supported from a plate 180, one end of which, namely the right-hand end as viewed in FIG. 3, is connected by means of flexible plates 181, which are, in turn, connected to an extension of the base plate 170 of the apparatus. The other, or left-hand end of the plate 180, is movable to a limited extent in a vertical direction, in response to vertical movement of an adjustment block 182 (FIG. 3), which is connected to the plate 180 by another pair of flexible plates 183 and is mounted on a vertical shaft 184 extending from the depth-of-cut adjustment knob 22 on top of the apparatus, all the way through to the base plate 170. Rotation of the depth-of-cut adjustment knob 22 moves the adjustment block 182, vertically, which has the effect of moving the cutter blade bearing blocks 176 and 178 vertically, to provide a limited depth-of-cut adjustment. The depth-of-cut adjustment knob 22 is preferably calibrated in thousandths of an inch or some other convenient measure.

The shaft 174, on which the cutter blade 14 is mounted, extends through the bearing block 176 and has a drive pulley 186 mounted at its end. The drive pulley 186 is coupled by a drive belt 188 to a smaller pulley 190 on an intermediate shaft 192 (best shown in FIG. 2). Also on the intermediate shaft is yet another drive pulley 194, which is coupled in turn to the shaft of a drive motor 196, by another drive belt 198 connecting the pulley 194 to a smaller pulley 200 on the drive motor shaft. Both the drive motor 196 and the intermediate shaft 192 are, of course, supported on the base plate 170.

The work table 30 is, as best shown in FIG. 8, supported for sliding movement along a pedestal 210, which is, in turn, supported on and secured to the base plate 170. A clamping mechanism, including a pair of parallel spaced clamping bars 212 and a clamp cylinder assembly 214, is mounted on the table 30 for translational movement with it. The clamping bars 212 are pivoted about a horizontal axis at a pivot point indicated by reference numeral 216 located almost opposite the length-of-cut adjusting knob 26 and closer to one end of the clamping bars. Close to the opposite end of the clamping bars 212, a piston rod 218 extends substantially vertically between the bars and has an enlargement 220 below the bars and a further enlargement 222 above the bars. Upon vertical movement of the piston rod 218, the clamping bars 212 may be rotated upwardly or downwardly about the pivot point 216. The rod 218 is used to support the piston 90 disposed for movement in the clamping cylinder 88 (FIG. 7). Completing the clamping assembly is a presser bar 224 supported for relatively free rotational movement between the clamping bars 212, to ensure that the clamping force is applied uniformly along the package 10 to be clamped.

As shown in FIG. 8, the clamp presser bar 224 is mounted on an eccentric element 225, adjustment of which raises or lowers the presser bar 224 with respect to the clamp bars 212. More specifically, as shown in detail in FIG. 11, the eccentric element 225 is biased by a coil spring 226 toward the right as viewed in the figure. The eccentric element 225 has a head portion 225a extending through a hole in one of the clamping bars 212, an eccentric portion 225b integral with the head portion and engaging a hole in the presser bar 224, and a further portion 225c on which is mounted an internal gear 227. When the element 225 is biased as far as possible to the right, the gear 227 engages an external gear 228 and prevents rotation of the element 225. A mounting assembly 229, including a plate 229a, screws 229b and lock nuts 229c, limits axial movement of the eccentric element 225 in a left-hand direction. The plate 229a is secured to the left-hand clamping bar 212 (in FIG. 11) by the screws 229b, so that the spring 226 urges the element 225 to the right with respect to the clamping bars 212. Height adjustment of the bar 224 is effected by depressing and turning the head portion 225a of the element 225. This adjustment is used to reduce the initial clearance between the presser bar 224 and the package 10 to be clamped, to minimize the danger of having a finger caught between the presser bar, and to minimize the stroke of the clamping assembly, to ensure that the package cannot be accidentally placed over a package stop plate 254, to be described shortly.

Figure 2:
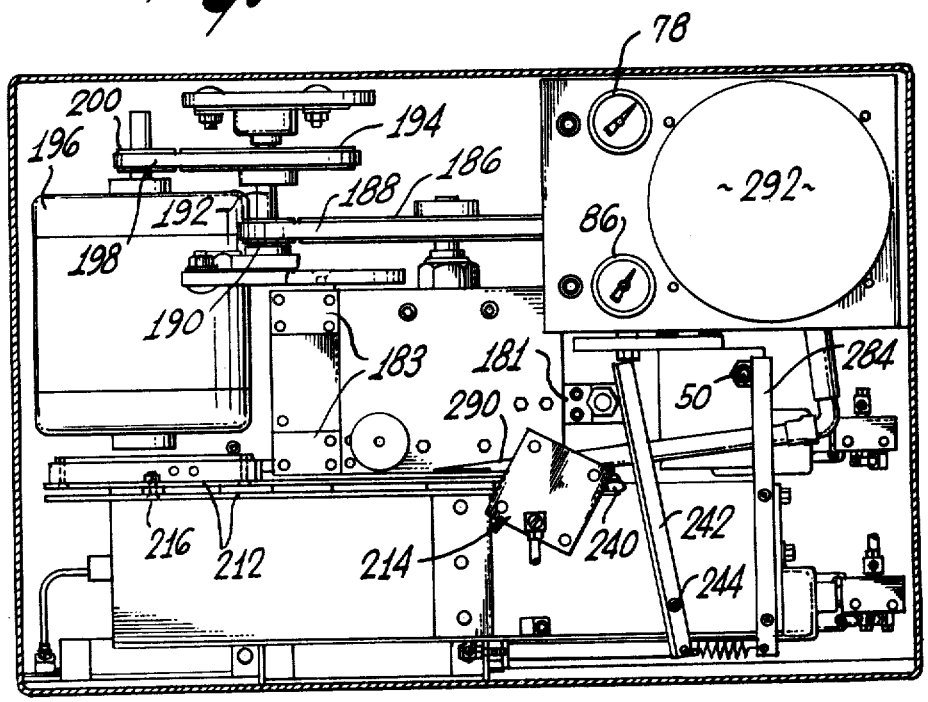
FIG. 2 is a top plan view of the apparatus of the invention with the external cover shown only in section.

The clamping bars 212 are also adjustable longitudinally, as shown in FIG. 3, by means of the length-of-cut adjustment knob 26. The longitudinal movement is effected by means of the adjustment knob 26, which is attached to a vertical shaft 230, on which is mounted a small gear 232. The gear 232 engages a gear rack 234 secured to the rear of one of the clamp bars 212. Movement of the clamping bars in this longitudinal sense has two significant effects. First, the position of the clamp presser bar 224 is moved with respect to a forward stop against which the part 10 is disposed. This ensures that the clamp presser bar 224 applies a clamping force close to the middle of the package 10, regardless of the length of the package being cut. The second effect of the length-of-cut adjustment is that, as shown in FIG. 2, a clamp arm bumper 240 at one end of the clamp bars 212 is moved with respect to the table when the adjustment is made. A reverse switch actuator arm 242 is pivoted on the table, at 244 and is movable about its pivot by the bumper 240. Thus, the angular position of the reverse switch actuator arm 242 is determined by the position of the bumper 240 with respect to the table 30, and hence by the position of the length-of-adjustment knob 26. For example, if the length-of-cut adjustment knob 26 is adjusted for a relatively short cut, the clamp bars 212, and with them the bumper 240, will be moved to the right, as viewed in FIGS. 2 and 6, and the actuator arm 242 will also be rotated to the right, i.e., clockwise. Accordingly, when the table 30 is translated to the right, a relatively short distance will be traversed before the actuator arm 242 encounters the reverse switch 50 and thereby reverses the direction of translation.

The width-of-cut adjustment is effected by knob 24, which is attached to a shaft 250, at the lower end of which is mounted an eccentric cam 252. The cam 252 bears on a stop plate 254 which is secured to the end of a vertically disposed flexure member 256, which is in turn secured to the base plate 170. The stop plate protrudes slightly above table height and is disposed parallel to the plane of the cutter blade 14. Accordingly, by rotation of the adjustment knob 24, the stop plate 254 is moved transversely with respect to the cutter blade 14 and provides a width-of-cut adjustment. More precisely, the adjustment is a transverse position-of-cut adjustment, but since the width of the cutter blade 14 is typically greater than the required width of cut on the package cover, transverse movement of the stop plate 254 effectively provides a width-of-cut adjustment.

Figure 10:
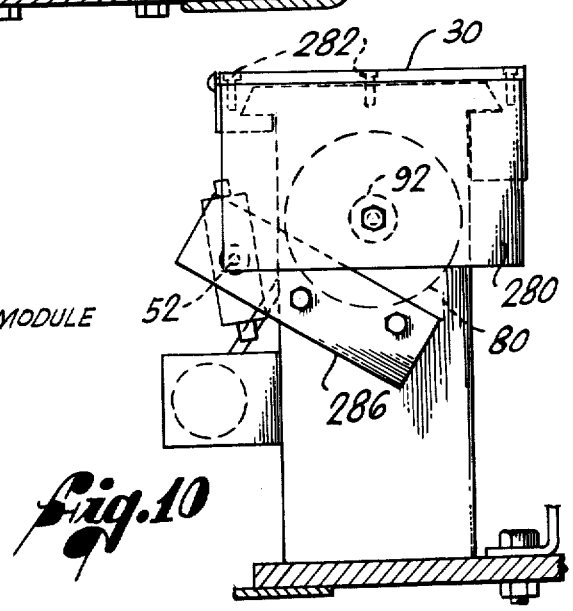
FIG. 10 is a fragmentary end elevational view, partly in section, taken generally in the direction of the arrow 10 in FIG. 3.

The pneumatic cylinder 80 and the hydraulic cylinder 98 are mounted beneath the table, as shown by the end view of the cylinders in FIG. 10. The piston rod 92 is secured to a vertical plate 280, which is, in turn, secured to the table 30, as by cap screws 282 in FIG. 10. In this manner, movement of the drive piston 92 is directly coupled to translate the table 30 in the desired direction. Near the end of the return stroke of the table, the stop switch 52, shown in FIG. 10, as mounted on a bracket 286, is opened, preventing reverse movement of the table 30. Secured to the top of the table at the same end as the plate 280 is a second switch actuator 284 positioned to actuate the reverse switch slightly after the stop switch is opened.

A vacuum suction pipe, indicated at 290 in FIG. 2, is positioned with its open end close to the point of cutting of the cutting blade 14, to pick up metal fragments immediately, and to minimize the risk of contamination of the package. The pipe 290 is connected to a vacuum pump and vacuum motor, indicated generally at 292. A filter system (not shown) keeps the metal fragments in a container.

It will be appreciated from the foregoing that the present invention represents a significant advance in relation to the assembly, testing and repair of microcircuit packages, such as are used to contain hybrid circuitry. In particular, the invention provides a hitherto unavailable technique for reliably removing the covers from these packages so that rewiring or repair may be effected without having to rework the package surface before replacing the cover. The apparatus of the invention is not only accurate and reliable, but is simple and safe to operate. It will also be appreciated that, although a specific embodiment of the invention has been described in detail for purposes of illustration, various modifiations may be made without departing from the spirit and the scope of the invention. Accordingly, the invention is not to be limited except as by the appended claims.

I claim:

1. Apparatus for removing a microcircuit package cover, said apparatus comprising:
   a frame;
   a work table mounted for sliding movement with respect to said frame;
   a motor driven rotary cutter blade mounted on said frame in an operative relationship with said work table;
   clamping means for releasably securing a microcircuit package on said worktable, including a clamping lever pivotally mounted on said table, and a clamping actuator coupled to said lever to raise and lower it with respect to said table, whereby the package is clamped to said table by downward urging of said clamping lever;
   depth-of-cut control means, for varying the position of said cutter blade vertically with respect to said table;
   width-of-cut control means, including a stop plate against which the package is secured, and means for varying the transverse spacing between said cutter blade and said stop plate;
   table translating means, for moving the table through a cutting stroke and a return stroke parallel to the plane of said cutting blade; and
   length of cut control means to vary the length of the cutting and return strokes to conform with the package size;
   whereby the package lid can be removed by making four cutting strokes along the lid edges.

2. Apparatus as set forth in claim 1, wherein said table translating means includes
   a pneumatic cylinder and piston operable to drive said piston in either selected direction, said piston being connected to said table; and
   control means for initiating movement of said piston in a cutting stroke and for automatically reversing said piston as determined by the adjustment of the length-of-cut control means.

3. Apparatus as set forth in claim 1, wherein said means for varying the transverse spacing between said cutter blade and said stop plate includes:
   a flexure on which said stop plate is mounted;
   a cam engaging said flexure; and
   a control knob coupled to rotate said cam and thereby move said stop plate.

4. Apparatus for removing a microcircuit package cover, said apparatus comprising:
   a work table mounted for sliding movement;

a motor driven cutter blade mounted for rotation in an operative relationship with said work table;

clamping means for releasably securing a microcircuit package on said work table;

depth-of-cut control means, for varying the position of said cutter blade vertically with respect to said table;

width-of-cut control means, for varying the transverse spacing between said cutter blade and said table;

table translating means, for moving the table through a cutting stroke and a return stroke parallel to the plane of said cutting blade; and length of cut control means to vary the length of the cutting and return strokes to conform with the package size;

whereby the package lid can be removed by making four cutting strokes along the lid edges;

and wherein said clamping means includes
 a clamping lever pivotally mounted on said table,
 a clamping actuator coupled to said lever to raise and lower it with respect to said table, whereby the package is clamped to said table by downward urging of said clamping lever,
 a clamp presser bar pivotally attached to said clamping lever, and
 eccentric adjustment means to raise and lower said clamp presser bar with respect to said clamping lever.

5. A method for removing a cover from a microcircuit package, said method comprising the steps of:

adjustably securing a microcircuit package to a work table;

adjusting the effective width of cut of a cutter blade by moving a stop plate against which the package is secured;

adjusting the length of cut of the cutter blade;

adjusting the depth of cut of the cutter blade by moving it perpendicularly with respect to the work table;

actuating a switch to initiate a cutting operation;

translating the work table, in response to said actuating step, through a cutting stroke at a predetermined speed and a return stroke at a faster predetermined speed.

6. A method as set forth in claim 5, and further including additional securing, length-adjusting, actuating and translating steps, to make cuts along other edges of the package lid.

* * * * *